US007530272B2

(12) United States Patent
Liu et al.

(10) Patent No.: US 7,530,272 B2
(45) Date of Patent: May 12, 2009

(54) MULTIPLE FREQUENCY ULTRASOUND APPARATUS

(75) Inventors: Hao-Li Liu, Tao-Yuan (TW); Chao-Ming Hsieh, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 29 days.

(21) Appl. No.: 11/889,682

(22) Filed: Aug. 15, 2007

(65) Prior Publication Data

US 2009/0044626 A1 Feb. 19, 2009

(51) Int. Cl.
*G01H 13/00* (2006.01)
*H01L 41/00* (2006.01)

(52) U.S. Cl. ........................ 73/649; 73/579; 310/316.01

(58) Field of Classification Search .................. 73/661, 73/649, 658, 632, 866.5, 579; 310/316.01, 310/316.02, 323.01, 317
See application file for complete search history.

(56) References Cited

U.S. PATENT DOCUMENTS

| | | | | |
|---|---|---|---|---|
| 5,834,871 | A * | 11/1998 | Puskas | 310/316.02 |
| 6,002,195 | A * | 12/1999 | Puskas | 310/325 |
| 6,181,051 | B1 * | 1/2001 | Puskas | 310/316.01 |
| 6,242,927 | B1 * | 6/2001 | Adams et al. | 324/664 |
| 6,313,565 | B1 * | 11/2001 | Puskas | 310/316.01 |
| 6,433,460 | B1 * | 8/2002 | Puskas | 310/317 |
| 6,453,836 | B1 * | 9/2002 | Ditmore | 114/140 |
| 6,462,461 | B1 * | 10/2002 | Puskas | 310/323.01 |
| 6,822,372 | B2 * | 11/2004 | Puskas | 310/317 |
| 2007/0249941 | A1 * | 10/2007 | Salehi et al. | 600/471 |

* cited by examiner

*Primary Examiner*—Helen C. Kwok
(74) *Attorney, Agent, or Firm*—Bacon & Thomas, PLLC

(57) ABSTRACT

The invention disclosed that the multiple frequency ultrasound apparatus using unique transducer will contain many actuations module, a coupled circuit and a transducer. Each actuation module can separately output the signal of the different frequency, the coupled circuit connecting the actuation module for coupling with the signal of the different frequency. The transducer can receive the signal of the multiple frequencies, then for outputting the multiple ultrasound frequency by the way of transferring from the electrical energy to the mechanical energy.

9 Claims, 7 Drawing Sheets

MULTIPLE FREQUENCY ULTRASOUND APPARATUS

BACKGROUND OF THE INVENTION

1. Field of the Invention

The invention relates to an ultrasound apparatus, more particularly for applying to a multiple frequency ultrasound apparatus.

2. Description of the Prior Art

The ultrasound mainly is the sort of mechanical vibration wave produced by the electrical field, normally the hertz of the wave over than 20 KHz will be named as the ultrasound. The present application as the tool for the ultrasound will be the followings, such as measuring thickness, measuring distance, medical treatment, medical diagnosis or ultrasound imaging and so on. Processing materials by using ultrasound will be for changing or accelerating change material characteristic or conditions including physics, chemistry, biological characteristic or condition. For example: "the acoustic cavitation effect" is produced under the liquid by the ultrasound, especially will be applied to the function of manufacturing, cleaning, welding, emulsifying, smashing, degasification, promoting chemical reactions and medical treatments.

The air bubble cracking induced from the acoustic cavitation effect may effectively strengthen effect of the ultrasound, also may apply to many applications including the integrated circuit industry, the electrical appliances, the computer and the related peripheral industry, the photo-electricity industry, the machinery board or the module of the precision mechanical industry, to the drugs manufacturing industry, the agricultural chemicals industry, the biological technology industry, food manufacturing industry, chemistry material manufacturing industry, the chemical product manufacturing industry, the petroleum manufacturing industry, rubber product manufacturing industry, the percutaneous implant for the medical use, the toothbrush for the family use, the milk bottle, the eyeglasses, the jewelry, cleaning for the cosmetology, stirring applications and medicine permeating.

The acoustic cavitation effect is one sort of physical phenomenon, that is, when the mechanical wave transmitting in the liquid, the mechanical wave will periodically force to the liquid, also there are the gas nuclei existing, the mechanical vibration wave will push or pull the liquid by periodically forcing, therefore the previous gas nuclei will gradually expand and grow as the big air bubble.

Referring as FIG. 1, the conventional technology will be illustrated as the followings, a single frequency ultrasound apparatus having the power circuit 11, the signal processing circuit 12, the electronic amplifier 13, the impedance matching circuit 14 and the transducer 15. The power circuit 11 is used to supply the necessary electric power of the every element part. The signal processing circuit 12 is used to produce the waveform signal of the predetermined frequency. The electronic amplifier 13 is used to enlarge the waveform signal of the predetermined frequency. The impedance matching circuit 14 is used to match for the input or output system impedance. The transducer 15 is used to receive the enlarged waveform signal of the predetermined frequency, and to transfer the electrical energy as the mechanical energy, then producing the ultrasound of the predetermined frequency.

The conventional technology for the multiple frequency ultrasound system is combined with the previous multiple every different frequency ultrasound apparatus, such as the dual frequency ultrasound clean system is set by two units of the different single-frequency ultrasound apparatus in the water, in order to make two kinds of different frequency in the water. Due to the manufacturing cost of the multi-frequency ultrasound system will be quite expensive, therefore outputting machinery wave for several kinds of frequency using unique transducer will assist to reduce the cost of the element part, also will produce the stronger acoustic cavitation effect.

Furthermore, although in the American Patent U.S. Pat. Nos. 5,834,871, 6,002,195, 6,181,051, 6,433,460, 6,822,372, 6,313,565, 6,462,461 and 6,453,836, these granted patent documents seem quite similar with the invention, however, still there is no more any previous patent document related about the invention. They are not able to cover the related technology of the present invention.

SUMMARY OF THE INVENTION

In accordance with the present invention, an apparatus is provided for power circuit of light emitting diode.

The foregoing, as well as additional objects, features and advantages of the invention will be more readily apparent from the following detailed description, which proceeds with reference to the accompanying drawings.

The invention, the multiple frequency ultrasound apparatus using unique transducer will contain many actuations module, a coupled circuit and a transducer only. Each actuation module can separately output the signal of the different frequency, the coupled circuit connecting the actuation module for coupling with the signal of the different frequency as the actuation signal having multiple frequencies; the transducer can receive the signal of the multiple frequencies, then by the way of transferring from the electrical energy to the mechanical energy for outputting the multiple-frequency ultrasound.

The main purpose of the invention is for providing unique transducer been driving by the multi-frequency actuation voltage in order to saving the manufacturing cost of the element part.

Another main purpose of the invention is for providing unique transducer producing the stronger acoustic cavitation effect as the multiple frequency ultrasound system.

Comparing with the prior art, the total advantage for the invention can be described as the followings:

1. The acoustic cavitation effect is more easily produced by the invention.
2. Due to using only one transducer for the invention, it will reduce the manufacturing cost.
3. The invention can enhance the application of the ultrasound used in the medical fields including the tumor treatment, the percutaneous implant.
4. The invention can effectively enhance the efficiency of the ultrasound cleaning apparatus used in the integrated circuit board manufacturing and assembling industry.
5. The occupation space and the selected materials for the machine body will be totally reduced due to using unique single transducer. Also, the invention can be applied to the stirring, cleaning and space limitation related industry including food, chemistry and eyeglass.
6. Due to producing the different focus, the application for the invention of the multiple frequency type can be more flexible in use, such as toothbrush and jewellery cleaning.
7. Under the wave, the invention can be used in the multiple equipments and environments, such as different demonstration and experimentation in the laboratory.
8. The frequency can be effectively controlled and setting, so that the invention will be quite practical.

9. Due to the output power can be controlled and setting, so that the application fields will be more enlarged.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention firstly will be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

Figure 1:
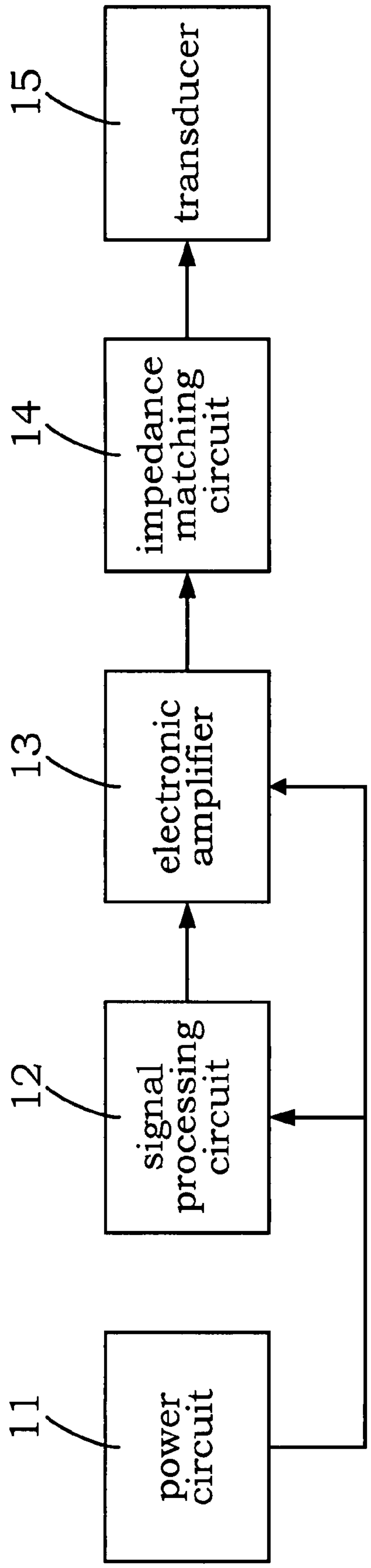
FIGURE 1 (Prior Art)
FIG. 1 is schematically illustrating the prior art.
Figure 2:
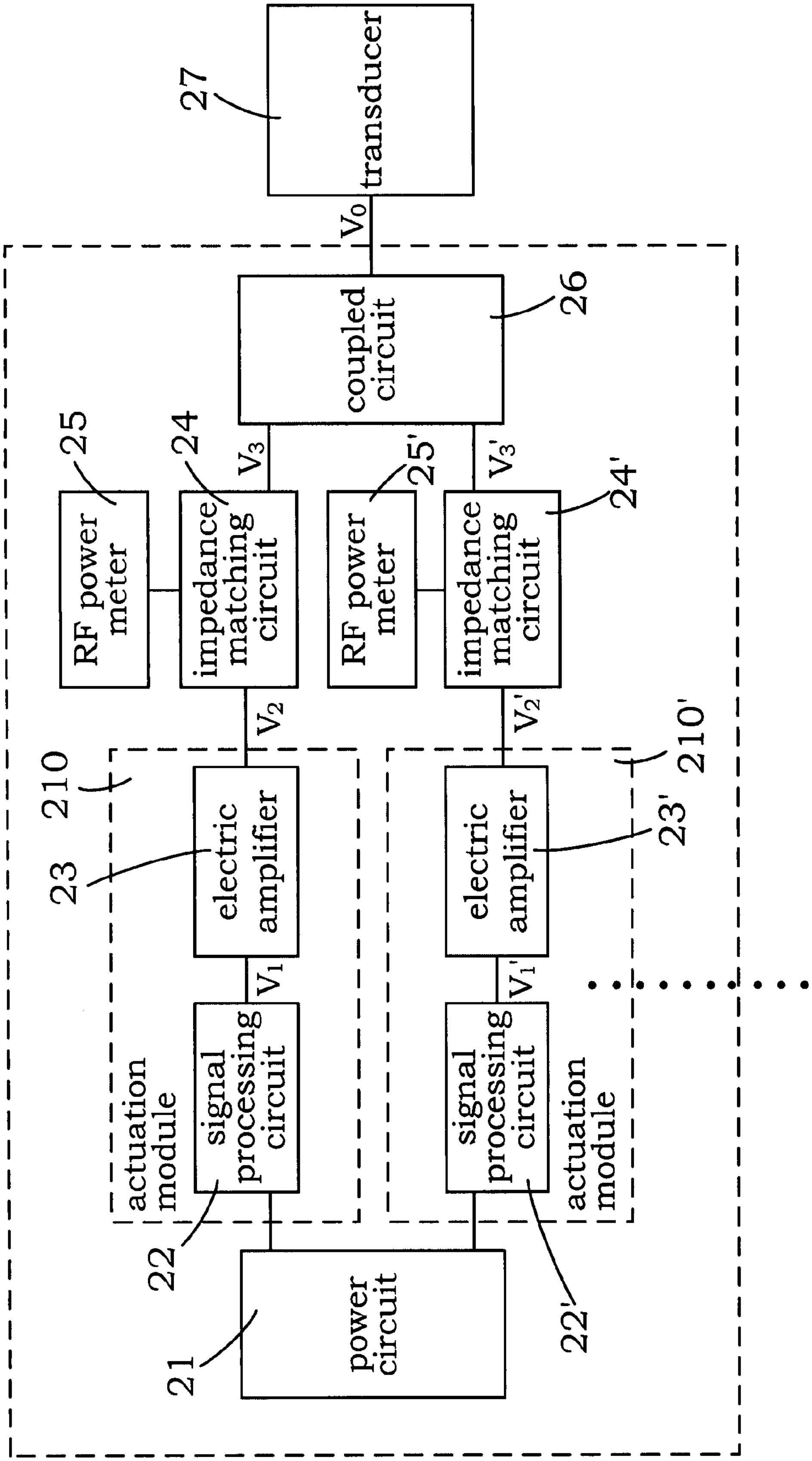
FIG. 2 is schematically illustrating the first preferred embodiment of the invention.

Referring as FIG. 2, the first preferred embodiment of the invention, the multiple frequency ultrasound apparatus will comprise the followings:

Firstly, power circuit 21 is for providing the power source. Then, actuation module 210 will comprise signal processing circuit 22 that is for producing a plurality of different driving signals and electronic amplifier 23 that is for increasing the power of a signal. Another, such as actuation module 210' will comprise signal processing circuit 22' that is for producing a plurality of different driving signals and electronic amplifier 23' that is for increasing the power of a signal. Impedance matching module 24 and Impedance matching module 24' both are for producing the output impedance signal. There are RF power meter 25, RF power meter 25' and coupled circuit 26 that is for outputting a coupled output signal. Finally, transducer 27 normally can convert a signal from one form to another.

The power circuit 21 will be connected to the actuation module 210 and the actuation module 210', wherein the actuation module 210 having the signal processing circuit 22 and the electronic amplifier 23, another, the actuation module 210' having the signal processing circuit 22' and the electronic amplifier 23', then be connected to the impedance matching module 24 that is connected with the RF power meter 25 and the impedance matching module 24' that is connected with the RF power meter 25', next, be connected to the coupled circuit 26, finally be connected to transducer 27.

The transducer 27 is for receiving the output signal $V_0$ from the signal processing apparatus 200, then the transducer 27 will produce the mechanical vibration wave of the predetermined frequency using the piezoelectric crystal under the electric field.

Still as FIG. 2, the power circuit 21 of the invention is for providing the necessary power source $V_{ref}$, and then actuation module 210 will output actuation signal $V_2$ of the first frequency $f_1$, the actuation module 210' will output actuation signal $V_2'$ of the second frequency $f_2'$, the frequency range for the first frequency $f_1$ or the second frequency $f_2$ can be provided between about 20 KHz to 100 MHz, also the first frequency $f_1$ or the second frequency $f_2$ are totally different.

Shown as FIG. 2, the actuation module 210 comprises the signal processing circuit 22 and the electronic amplifier 23, also, the actuation module 210' comprises the signal processing circuit 22' and the electronic amplifier 23'. Wherein, the signal processing circuit 22 can output the waveform $V_1$, the signal processing circuit 22' can output the waveform $V_1'$, especially the waveform $V_1$ and the waveform $V_1'$ are different. The electronic amplifier 23 or the electronic amplifier 23' can amplify the power for the waveform $V_1$ and the waveform $V_1'$, becoming as the driving signal $V_2$ and the driving signal $V_2'$. As the dot-line of FIG. 2 shown, there will be more sets (more than previous 2 sets only) of the actuation module such as 3 sets, 4 sets or more sets for the actuation module.

Again, referring as FIG. 2, the impedance matching module 24 is connected the electronic amplifier 23, the impedance matching module 24' is connected the electronic amplifier 23' for matching the system impedance, and then outputting the best power, as the impedance matching signal $V_3$ and the impedance matching signal $V_3'$ to the coupled circuit 16.

As FIG. 2, for making the result of the signal transferring well, the impedance matching module 24 will match the impedance (approximately 20~1000'Ω) of the transducer 27 and the output impedance (approximately 50~500'Ω) of the electronic amplifier 23, also, the impedance matching module 24' will match the impedance (approximately 20~1000'Ω) of the transducer 27 and the output impedance (approximately 50~500'Ω) of the electronic amplifier 23' by using the transferring property of the transformer.

FIG. 2 illustrates that the RF power meter 25 will monitor the signal power output of the impedance matching module 24, and the RF power meter 25' will monitor the signal power output of the impedance matching module 24'. Normally the RF power meter 25, or the RF power meter 25' having the power sensor element and the power measuring circuit will respectively input the different signal to the impedance matching module 24 or the impedance matching module 24'.

There are two input nodes for the coupled circuit 26, thus every input node respectively will couple with the impedance matching module 24 and the impedance matching module 24'. The coupled circuit 26 will couple with the impedance matching signal $V_3$ and the impedance matching signal $V_3'$, then the coupled circuit 26 will output the coupled output signal $V_0$ to the transducer 27, for transferring the electrical energy to the mechanical energy of the multiple frequency, such as 83 KHz +241 KHz. The coupled circuit 26 is composed mainly by using the magnetic coupled property, so that it can simultaneously input the signal of the different frequency. Therefore the coupled circuit 26 could output the signal of the different frequency by the coupled method. If the coupled circuit 26 uses the poly-phase transformer, then the coupled circuit 26 could produce the coupled signal of the multiple frequencies for the driving signal of the transducer 27, therefore the transducer 27 can produce the signal for more than three sorts of frequencies. In the practical, the coupled circuit 26 can be carried out by the power divider or the magnetic coupling method.

The signal processing circuit 22 and the signal processing circuit 22' are totally the same; there are two preferred embodiments for the signal processing circuit 22.

The transducer 27 is for receiving the output signal $V_0$ from the signal processing apparatus 200, then the transducer 27 will produce the mechanical vibration wave of the predetermined frequency using the piezoelectric crystal under the electric field.

Still as FIG. 2, the power circuit 21 of the invention is for providing the necessary power source $V_{ref}$, and then actuation module 210 will output actuation signal $V_2$ of the first frequency $f_1$, the actuation module 210' will output actuation signal $V_2'$ of the second frequency $f_2'$, the frequency range for the first frequency $f_1$ or the second frequency $f_2$ can be provided between about 20 KHz to 100 MHz, also the first frequency $f_1$ or the second frequency $f_2$ are totally different.

Shown as FIG. 2, the actuation module 210 comprises the signal processing circuit 22 and the electronic amplifier 23, the actuation module 210' comprises the signal processing circuit 22' and the electronic amplifier 23'. Wherein, the signal processing circuit 22 can output the waveform $V_1$, the signal processing circuit 22' can output the waveform $V_1'$, especially the waveform $V_1$ and the waveform $V_1'$ are different. The electronic amplifier 23 or the electronic amplifier 23' can amplify the power for the waveform $V_1$ and the waveform $V_1'$, becoming as the driving signal $V_2$ and the driving signal $V_2'$. As the dot-line of FIG. 2 shown, there will be more sets, more than 2 sets only such as 3 sets, 4 sets or more sets of the actuation module.

Again, referring as FIG. 2, the impedance matching module 24 is connected the electronic amplifier 23, the impedance matching module 24' is connected the electronic amplifier 23' for matching the system impedance, and then outputting the best power, as the impedance matching signal $V_3$ and the impedance matching signal $V_3'$ to the coupled circuit 26.

As FIG. 2, For making the result of the signal transferring well, the impedance matching module 24 will match the impedance (approximately 20~1000'Ω) of the transducer 27 and the output impedance (approximately 50~500'Ω) of the electronic amplifier 23, also, the impedance matching module 24' will match the impedance (approximately 20~1000'Ω) of the transducer 27 and the output impedance (approximately 50~500'Ω) of the electronic amplifier 23' by using the transferring property of the transformer.

FIG. 2 illustrates that the RF power meter 25 will monitor the signal power output of the impedance matching module 24, and the RF power meter 25' will monitor the signal power output of the impedance matching module 24'. Normally the RF power meter 25, or the RF power meter 25' having the power sensor element and the power measuring circuit will respectively input the different signal to the impedance matching module 24 or the impedance matching module 24'.

There are two input nodes for the coupled circuit 26, thus every input node respectively will couple with the impedance matching module 24 and the impedance matching module 24'. The coupled circuit 26 will couple with the impedance matching signal $V_3$ and the impedance matching signal $V_3'$, then the coupled circuit 26 will output the coupled output signal $V_0$ to the transducer 27, for transferring the electrical energy to the mechanical energy of the multiple frequency, such as 83 KHz +241 KHz. The coupled circuit 26 is composed mainly by using the magnetic coupled property, so that it can simultaneously input the signal of the different frequency. Therefore the coupled circuit 26 could output the signal of the different frequency by the coupled method. If the coupled circuit 26 uses the poly-phase transformer, then the coupled circuit 26 could produce the coupled signal of the multiple frequency for the driving signal of the transducer 27, therefore the transducer 27 can produce the signal for more than three sorts of frequencies.

Figure 3:
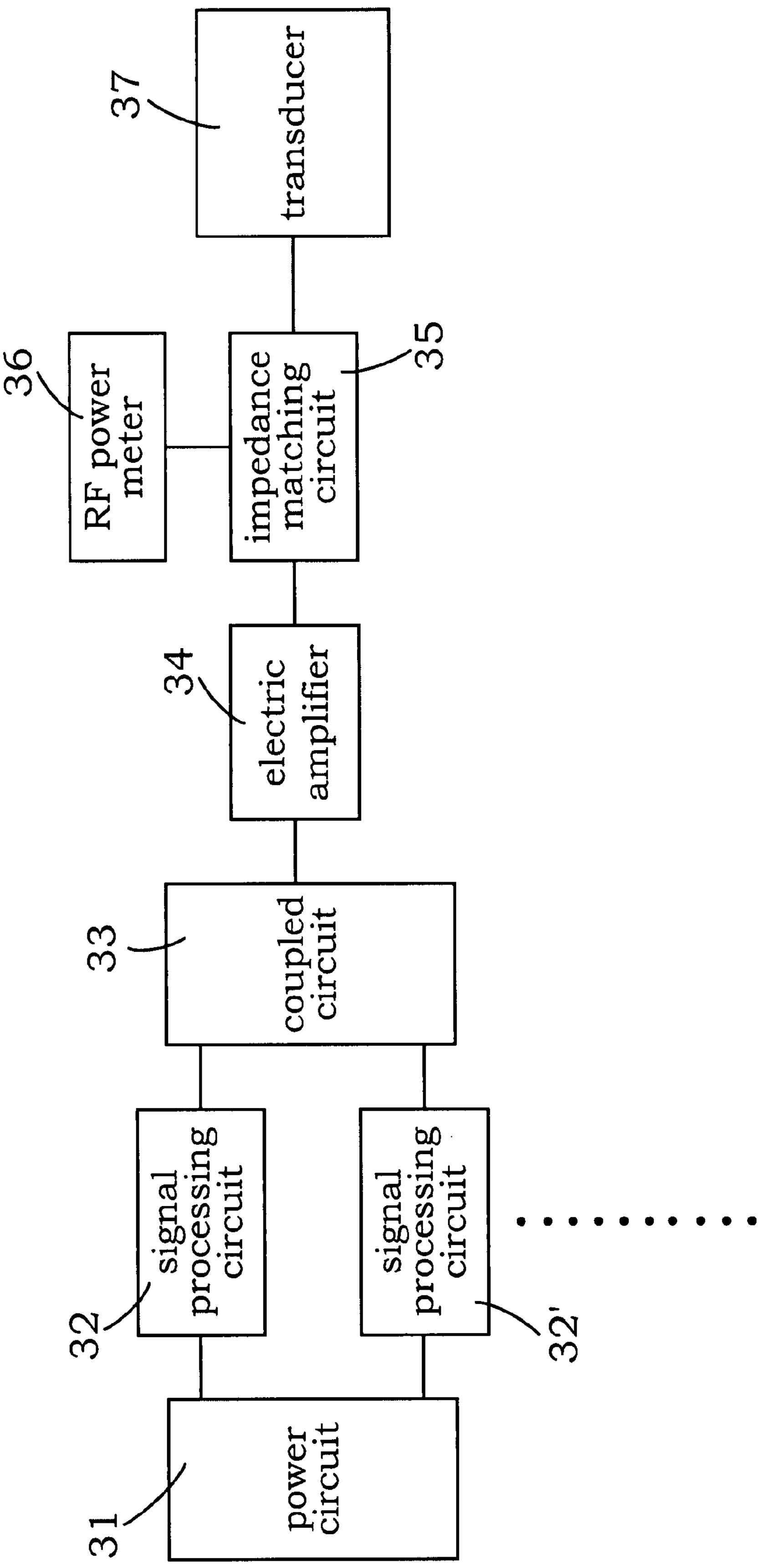
FIG. 3 is schematically illustrating the second preferred embodiment of the invention.

Referring as FIG. 3, similar with the previous preferred embodiment, another preferred embodiment of the invention for the multiple frequency ultrasound apparatus normally can comprise power circuit 31, two sets of signal processing circuit comprising signal processing circuit 32 and signal processing circuit 32', coupled circuit 33, electronic amplifier 34, impedance matching module 35, RF power meter 36 and transducer 37 respectively.

Thus, the power circuit 31 will be connected to the signal processing circuit 32 and the signal processing circuit 32', then, the previous signal processing circuit 32 and the signal processing circuit 32' both will be connected to the coupled circuit 33. There will be many sets, more than previous 2 sets only, such as 3 sets, 4 sets or more sets of the signal processing circuit. Then, the coupled circuit 33 will be connected to the electronic amplifier 34. Next, the electronic amplifier 34 will be connected to the impedance matching module 35. Also, the RF power meter 36 can be connected to the impedance matching module 35, and the transducer 37 will be connected to the impedance matching module 35.

In the mentioned-above preferred embodiments, the signal processing circuit 22, signal processing circuit 22', signal processing circuit 32 and signal processing circuit 32' are all can be carried out by the two preferred embodiments described as the followings.

Figure 4:
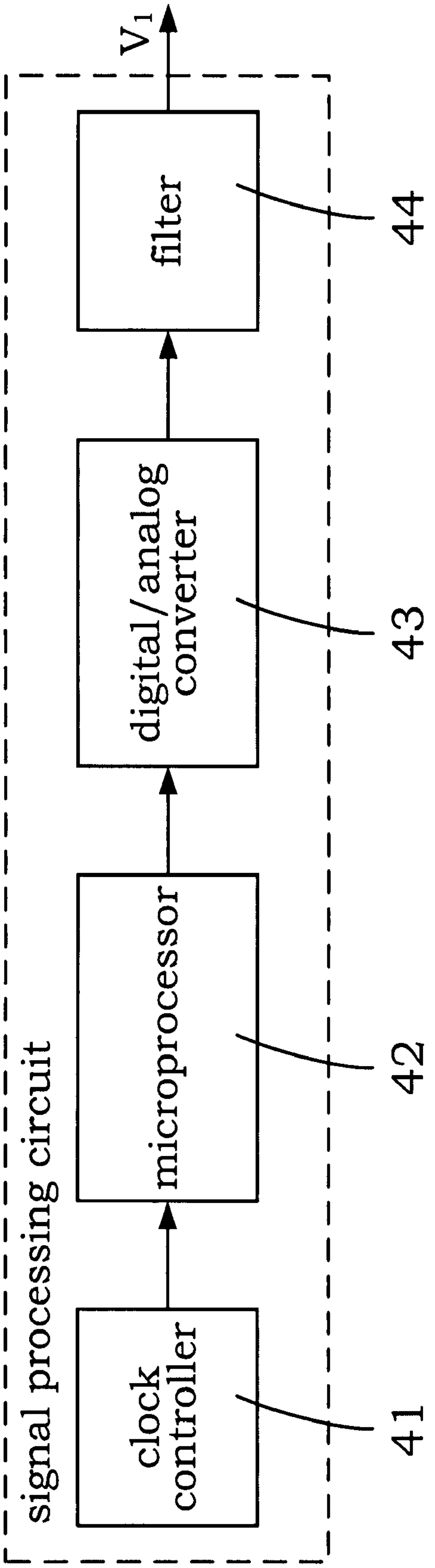
FIG. 4 is schematically illustrating the first preferred embodiment of the signal processing circuit.

FIG. 4 illustrates the first preferred embodiment for the signal processing circuit; there are the clock controller 41, the microprocessor 42, the digital/analog converter 43 and the filter 44. The output frequency of the microprocessor 42 can be controlled when the clock controller 41 changes the timing frequency of the pulse wave signal under operating, also can output the pulse wave signal to the operating frequency side (such as oscillator) of the microprocessor 42. In the same time, the clock controller 41 will produce the circuit by using the voltage-controlled oscillator (VCO) or the apparatus having the similar functions. In the practical, the low pass filter for the filter 44 will be selected.

Figure 5:
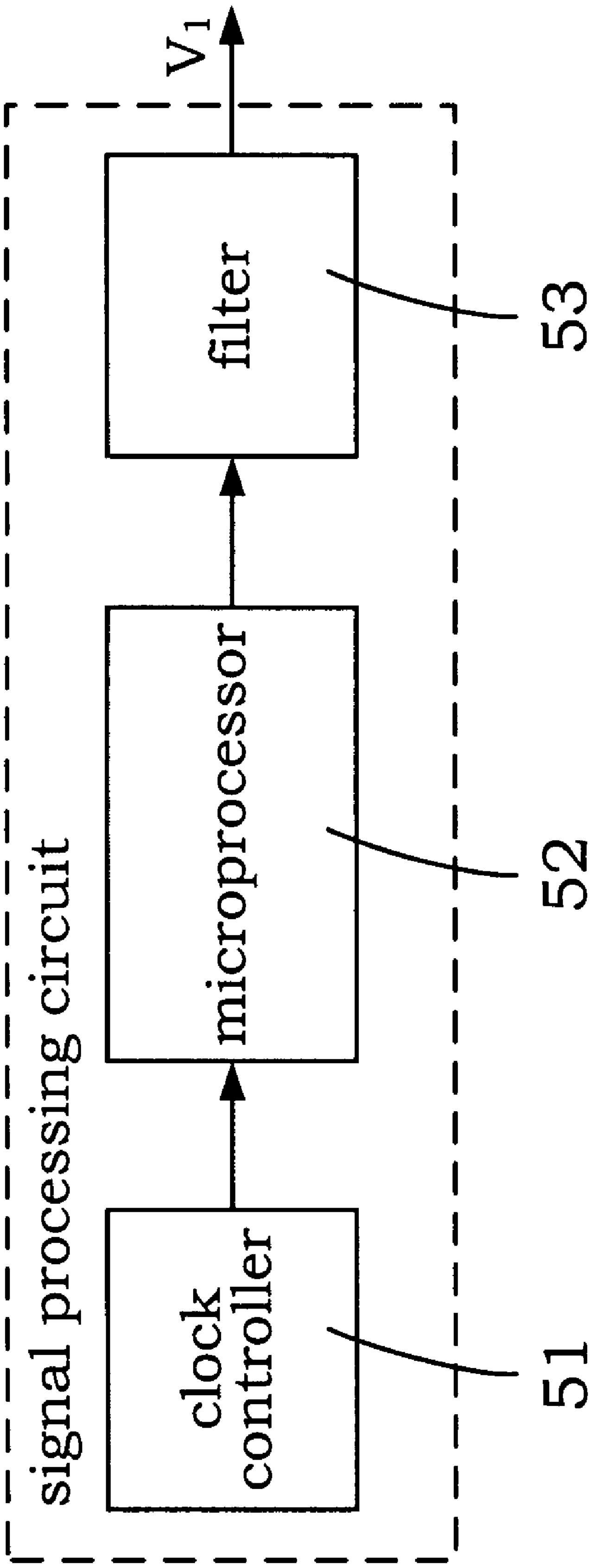
FIG. 5 is schematically illustrating the second preferred embodiment of the signal processing circuit.

As FIG. 5, the second embodiment showing the second preferred embodiment for the signal processing circuit. There are the clock controller 51, the microprocessor 52 and the filter 53. The microprocessor 52 can produce the square wave signal by using the coding method. Then the filter 53 will adjust the square wave signal to become as the output wave $V_1$ of the sinusoidal wave. In the practical, the low pass filter for the filter 53 will be selected.

Observing the result of the test experimentation for the invention, especially the effect of the multiple frequency ultrasound system using unique transducer ultrasonic, and judging the strength of the "acoustic cavitation effect" will be carried out by using the binarization method in order to calculate the amount of the air bubble.

Figure 6A:
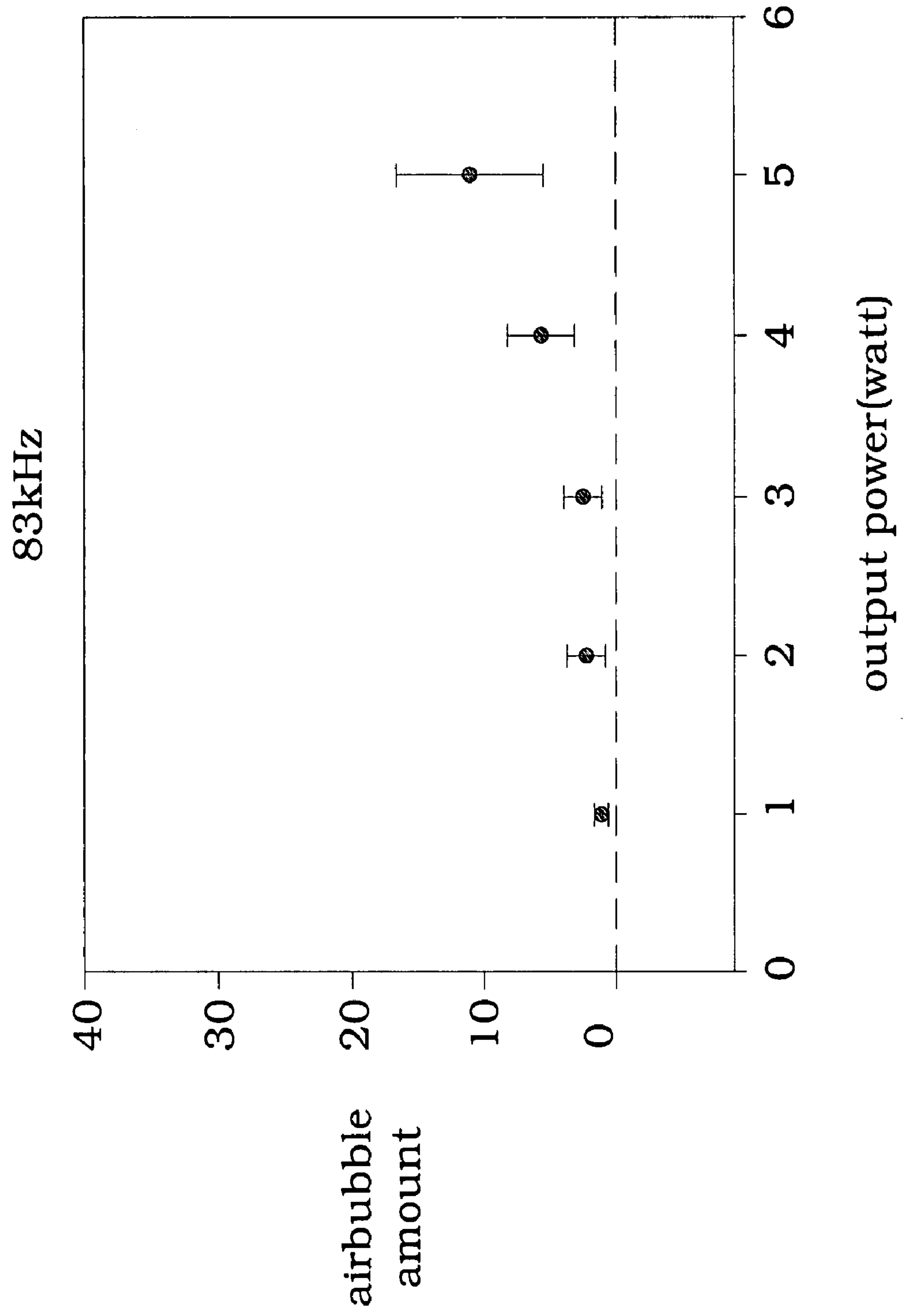
FIGURE 6A (Prior Art)
FIG. 6A is schematically illustrating the result of the test experimentation for the prior art.

As FIG. 6A, under the condition for the different output power (for example: 1 watt, 2 watts, 3 watts, 4 watts, 5 watts), comparing with the produced air bubble amount by the single frequency (for example: F=83 KHz) ultrasound actuating, about 5 air bubbles will be obtained under 4 watts, another, about 10 air bubbles will be obtained in 5 watts.

Figure 6B:
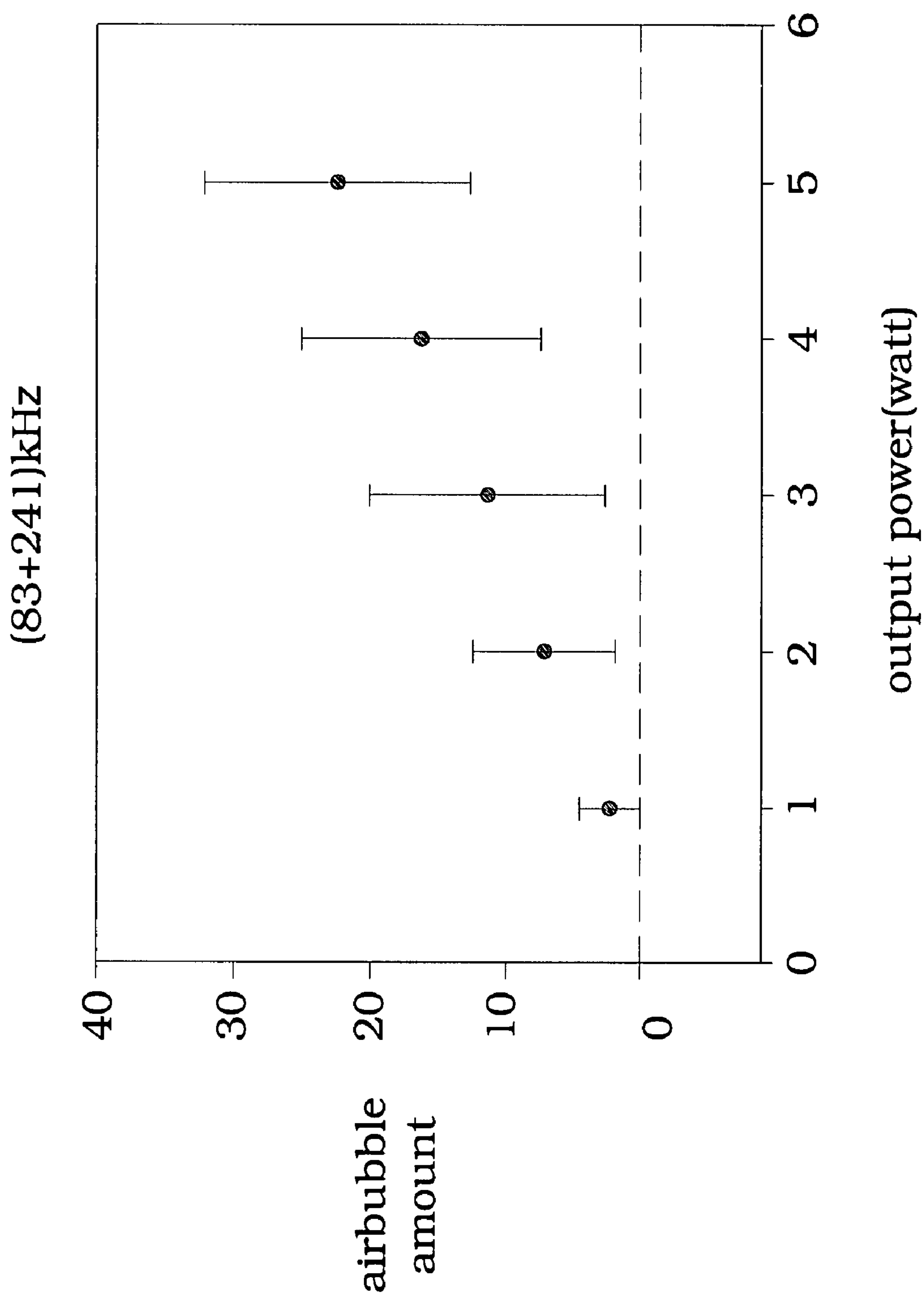
FIG. 6B is schematically illustrating the result of the test experimentation for the invention.

As FIG. 6B, under the condition for the different output power (for example: 1 watt, 2 watts, 3 watts, 4 watts, 5 watts), comparing with the produced air bubble amount by the dual frequency (for example: $f_1$=83 KHz, $f_2$=241 KHz) ultrasound actuating, about 15 air bubbles will be obtained under 4 watts, another, about 20 air bubbles will be obtained under 5 watts.

Under the same output power (for example: 5 watts), the produced air bubble amount by the single frequency (for example: f=83 KHz) ultrasound actuating, about 10 air bubbles can be obtained, also, the produced air bubble amount by the dual frequency (for example: $f_1$=83 KHz, $f_2$=241 KHz) ultrasound actuating, about 20 air bubbles can be obtained. Therefore, the previous result can verify that the acoustic cavitation effect for the dual frequency ultrasound actuating will be obviously promoted under the same output power rather than the single frequency ultrasound actuating.

The basic working theory for the invention is integrating the different signal of the different frequency from every different driving module individually outputting, comparing with the single frequency ultrasound apparatus, the dual frequency ultrasound apparatus of the invention will be the better effect, also the unique transducer is selected for the invention.

After the test experimentation verified, the invention can really produce the stronger acoustic cavitation effect, also the basic principle of the invention can be applied to the multiple frequency ultrasound apparatus. The unique transducer for the invention can output the mechanical energy of many sorts of frequency; the invention can obtain the stronger acoustic cavitation effect and can reduce the element cost of the multiple frequency ultrasound apparatus.

It is understood that various other modifications will be apparent and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A multiple frequency ultrasound apparatus, comprising:

a power circuit for providing a necessary power source;

a plurality of actuation module for producing a plurality of different driving signals;

an impedance matching module connecting with a RF power meter for producing an output impedance;

a coupled circuit for outputting a coupled output signal; and a transducer for converting a signal from one form to another; wherein the power circuit is connected to the plurality of actuation module, been connected to the impedance matching module that been connected with the RF power meter, been connected to the coupled circuit and been connected to the transducer as the multiple frequency ultrasound apparatus.

2. The apparatus according to claim 1, wherein every said actuation module comprises a signal processing circuit and an electronic amplifier.

3. The apparatus according to claim 2, wherein said signal processing circuit comprises a clock controller, a microprocessor, a digital/analog converter and a filter.

4. The apparatus according to claim 2, wherein said signal processing circuit comprises a clock controller, a microprocessor and a filter.

5. The apparatus according to claim 1, wherein said a frequency of said multiple frequency ultrasound comprises between about 20 KHz to 100 MHz.

6. A multiple frequency ultrasound apparatus using unique transducer, comprising:

a power circuit for providing a necessary power source;

a plurality of signal processing circuit for producing a plurality of different driving signals;

a coupled circuit for outputting a coupled output signal;

an electronic amplifier for increasing the power of a signal;

an impedance matching module connecting with a RF power meter for producing an output impedance; and a transducer for converting a signal from one form to another;

the power circuit been connected to the signal processing circuit and the signal processing circuit, been connected to the coupled circuit, been connected to the electronic amplifier, been connected to the impedance matching module that been connected with the RF power meter, been connected to the transducer as the multiple frequency ultrasound apparatus.

7. The apparatus according to claim 6, wherein said signal processing circuit comprises a clock controller, a microprocessor, a digital/analog converter and a filter.

8. The apparatus according to claim 6, wherein said signal processing circuit comprises a clock controller, a microprocessor and a filter.

9. The apparatus according to claim 6, wherein said a frequency of said multiple frequency ultrasound comprises between about 20 KHz to 100 MHz.

* * * * *